US012658903B2

(12) United States Patent

Pahkala et al.

(10) Patent No.: US 12,658,903 B2
(45) Date of Patent: Jun. 16, 2026

(54) SWITCHING CONVERTER CONTROLLER WITH ADAPTIVE PULSE-FREQUENCY MODULATION TIMER CIRCUIT

(71) Applicant: TEXAS INSTRUMENTS INCORPORATED, Dallas, TX (US)

(72) Inventors: Janne Pahkala, Oulu (FI); Ari Vaananen, Oulu (FI)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/590,450

(22) Filed: Feb. 28, 2024

(65) Prior Publication Data

US 2025/0274113 A1 Aug. 28, 2025

(51) Int. Cl.
| | |
|---|---|
| *H03K 7/06* | (2006.01) |
| *H03K 5/131* | (2014.01) |
| *H03M 1/72* | (2006.01) |
| *H03M 1/82* | (2006.01) |

(52) U.S. Cl.
CPC ............... *H03K 7/06* (2013.01); *H03K 5/131* (2013.01); *H03M 1/72* (2013.01); *H03M 1/827* (2013.01)

(58) Field of Classification Search
CPC ........... H03K 7/06; H03K 5/131; H03M 1/72; H03M 1/827
See application file for complete search history.

(56) References Cited

U.S. PATENT DOCUMENTS 11,563,378 B2 * 1/2023 Becker .................... H02M 1/14

FOREIGN PATENT DOCUMENTS

| CN | 114794586 | * | 7/2022 | |
|---|---|---|---|---|
| TW | 201220953 A | * | 5/2012 | ............. H03K 4/501 |

* cited by examiner

*Primary Examiner* — Lincoln D Donovan
*Assistant Examiner* — James G Yeaman
(74) *Attorney, Agent, or Firm* — Frank D. Cimino

(57) ABSTRACT

A switching converter controller includes: mode control logic; and a pulse-frequency modulation (PFM) timer circuit coupled to the mode control logic. The PFM timer circuit includes: a first terminal; a second terminal; a digital-to-analog converter (DAC); a current source; a capacitor; and a comparator. A first terminal of the DAC is coupled to the first terminal of the PFM timer circuit. The current source has a first terminal, a second terminal, and a third terminal. The second terminal of the current source is coupled to a second terminal of the DAC. A first terminal of the capacitor is coupled to the first terminal of the current source. The comparator has first, second, and third terminals. The first terminal of the comparator is coupled to the first terminal of the capacitor. The third terminal of the comparator is coupled to the second terminal of the PFM timer circuit.

20 Claims, 10 Drawing Sheets

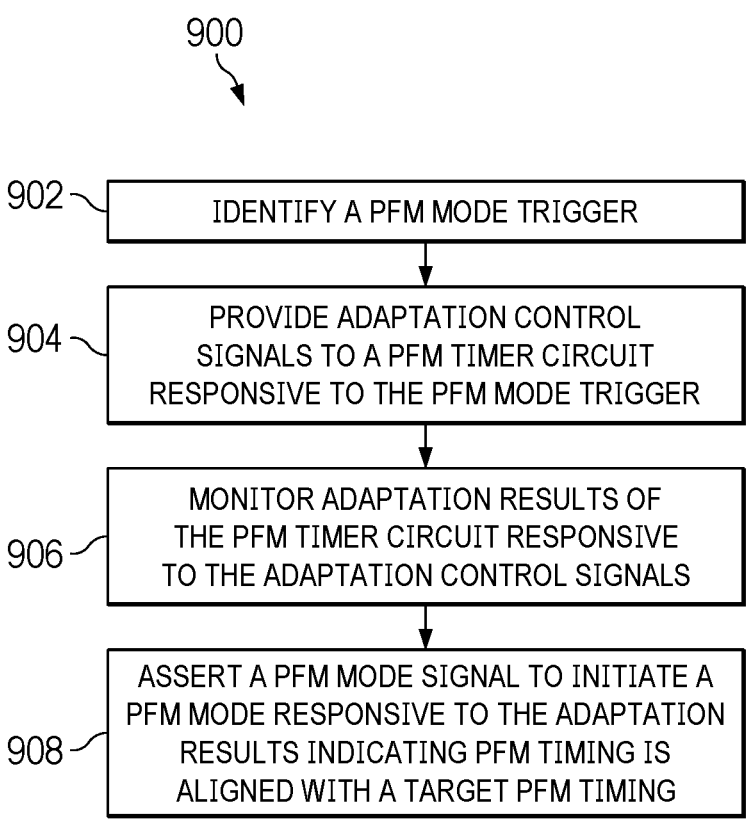

900

902 — IDENTIFY A PFM MODE TRIGGER

904 — PROVIDE ADAPTATION CONTROL SIGNALS TO A PFM TIMER CIRCUIT RESPONSIVE TO THE PFM MODE TRIGGER

906 — MONITOR ADAPTATION RESULTS OF THE PFM TIMER CIRCUIT RESPONSIVE TO THE ADAPTATION CONTROL SIGNALS

908 — ASSERT A PFM MODE SIGNAL TO INITIATE A PFM MODE RESPONSIVE TO THE ADAPTATION RESULTS INDICATING PFM TIMING IS ALIGNED WITH A TARGET PFM TIMING

1002 — RECEIVE A DIGITAL CONTROL SIGNAL

1004 — ADJUST A PFM TIMER CIRCUIT CURRENT RESPONSIVE TO THE DIGITAL CONTROL SIGNAL

1006 — CHARGE A CAPACITOR RESPONSIVE TO THE ADJUSTED CURRENT

1008 — COMPARE A CHARGE ON THE CAPACITOR TO A REFERENCE VOLTAGE TO OBTAIN A PFM TIMER RESULT

1010 — OUTPUT THE PFM TIMER RESULT

SWITCHING CONVERTER CONTROLLER WITH ADAPTIVE PULSE-FREQUENCY MODULATION TIMER CIRCUIT

BACKGROUND

Switching converters are used to provide a direct-current (DC) output voltage (VOUT) based on an input voltage (VIN). A typical switching converter includes: a power stage with switches and an inductor; and a controller for the switches of the power stage. Switching converter efficiency varies depending on proper management of switching control responsive to variations in VIN, VOUT, load, operating frequency, and inductance. Mode transitions of the controller in response to load changes (e.g., light load to heavy load, or heavy load to light load) are problematic, often causing inefficient operation and/or VOUT ripple.

SUMMARY

In an example, a switching converter controller includes: mode control logic; and a pulse-frequency modulation (PFM) timer circuit coupled to the mode control logic. The PFM timer circuit includes: a first terminal; a second terminal; a digital-to-analog converter (DAC); a current source; a capacitor; and a comparator. The DAC has a first terminal and a second terminal. The first terminal of the DAC is coupled to the first terminal of the PFM timer circuit. The current source has a first terminal, a second terminal, and a third terminal. The second terminal of the current source is coupled to the second terminal of the DAC. The capacitor has a first terminal and a second terminal. The first terminal of the capacitor is coupled to the first terminal of the current source. The comparator has first, second, and third terminals. The first terminal of the comparator is coupled to the first terminal of the capacitor. The third terminal of the comparator is coupled to the second terminal of the PFM timer circuit.

In another example, a switching converter controller includes: mode control logic; and a PFM timer circuit coupled to the mode control logic. The PFM timer circuit is configured to: receive a digital control signal; adjust a current of the PFM timer circuit responsive to the digital control signal; charge a capacitor responsive to the adjusted current; compare a charge on the capacitor to a reference voltage to obtain a PFM timer result; and output the PFM timer result.

In yet another example, a system includes: a power stage; and a switching converter controller coupled to the power stage. The switching converter controller includes a PFM timer circuit and is configured to: identify a PFM mode trigger; provide adaptation control signals to the PFM timer circuit responsive to the PFM mode trigger; monitor adaptation results of the PFM timer circuit; and transition to a PFM mode responsive to the adaptation results of the PFM timer circuit indicating PFM timing is ready.

BRIEF DESCRIPTION OF THE DRAWINGS

FIG. 9 is a flowchart showing an example switching converter controller method.

DETAILED DESCRIPTION

Figure 1:
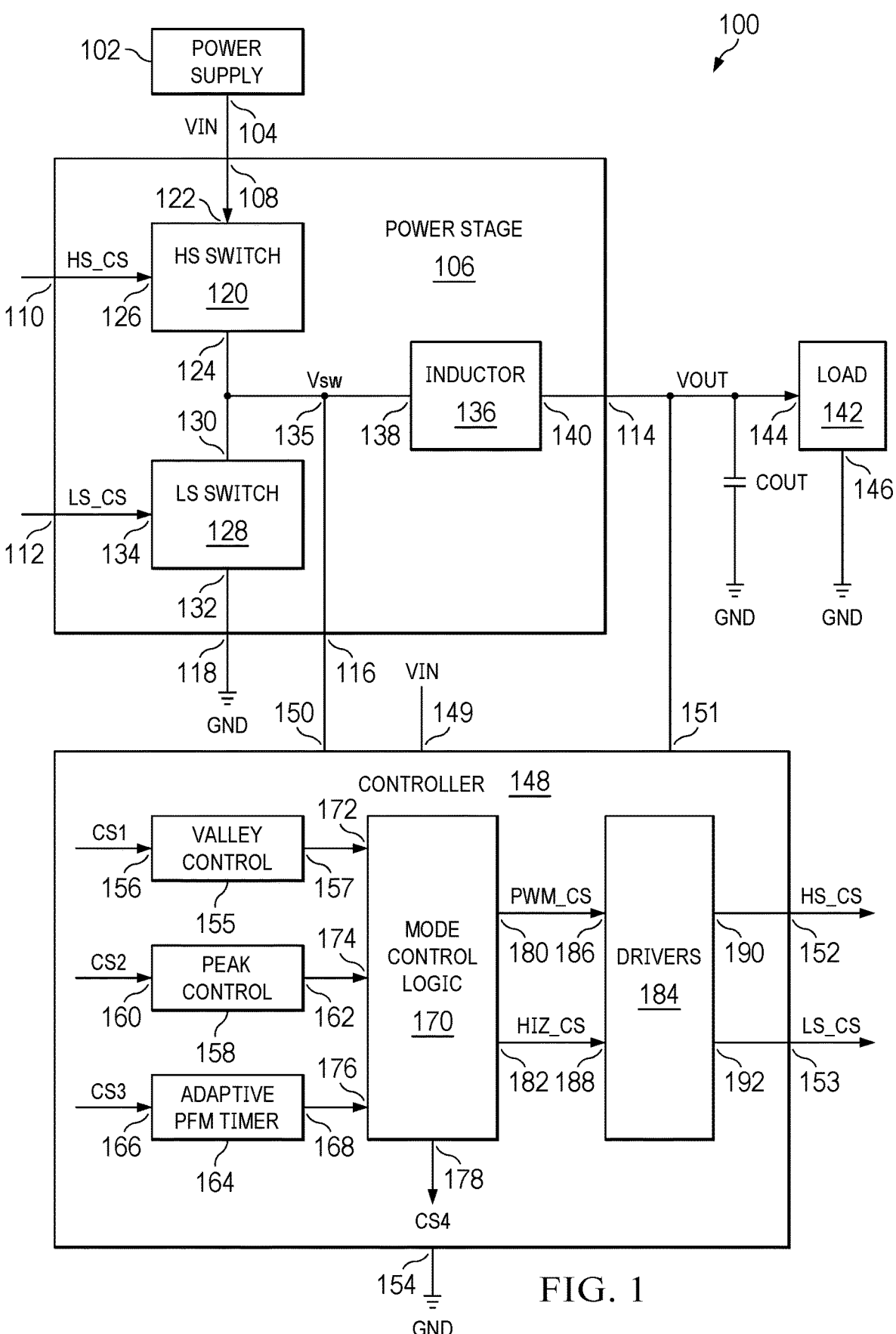
FIG. 1 is a diagram showing an example system.

The same reference numbers or other reference designators are used in the drawings to designate the same or similar features. Such features may be the same or similar either by function and/or structure.

FIG. 1 is a diagram showing an example system 100. The system 100 includes a power supply 102, a power stage 106, an output capacitor (COUT), a load 142, and a controller 148. The power supply 102 has a terminal 104. The power stage 106 has a first terminal 108, a second terminal 110, a third terminal 112, a fourth terminal 114, a fifth terminal 116, and a ground terminal 118. COUT has a first terminal and a second terminal. The load 142 has a terminal 144 and a ground terminal 146. The controller 148 has a first terminal 149, a second terminal 150, a third terminal 151, a fourth terminal 152, a fifth terminal 153, and a ground terminal 154.

As shown, the power stage 106 includes a high-side (HS) switch 120, a low-side (LS) switch 128, and an inductor 136 in the arrangement shown. In some examples, the HS switch 120, LS switch 128, and related drivers are components of an integrated circuit (IC), and the inductor 136 is an external component relative to the IC. The arrangement of components for the power stage 106 of FIG. 1 is referred to as a buck converter topology, where the output voltage (VOUT) is lower than the input voltage (VIN). In other examples, the topology of the power stage 106 may vary. In the example of FIG. 1, the HS switch 120 has a first terminal 122, a second terminal 124, and a control terminal 126. The LS switch 128 has a first terminal 130, a second terminal 132, and a control terminal 134. In some examples, the HS switch 120 may be a p-channel field-effect transistor ("PFET") or an n-channel field-effect transistor ("NFET"), and the LS switch 128 may be an NFET. The inductor 136 has a first terminal 138 and a second terminal 140.

The controller 148 includes valley control circuitry 155, peak control circuitry 158, an adaptive pulse-frequency modulation (PFM) timer circuit 164, mode control logic 170, and driver circuitry 184. The valley control circuitry 155 has input(s) 156 and an output 157. The peak control circuitry 158 has input(s) 160 and an output 162. The adaptive PFM timer circuit 164 has first terminal(s) 166 and a second terminal 168. The mode control logic 170 has a first terminal 172, a second terminal 174, a third terminal 176, a fourth terminal 178, a fifth terminal 180, and a sixth terminal 182. The driver circuit 184 has a first terminal 186, a second terminal 188, a third terminal 190, and a fourth terminal 192.

The first terminal 108 of the power stage 106 is coupled to the terminal 104 of the power supply 102 and receives VIN. The first terminal 149 of the controller 148 is also coupled to the terminal 104 of the power supply 102 and/or the first terminal 108 of the power stage 106. The second terminal 110 of the power stage 106 is coupled to the fourth terminal 152 of the controller 148 and receives a HS switch control signal (HS_CS). The third terminal 112 of the power stage 106 is coupled to the fifth terminal 153 of the controller 148 and receives an LS switch control signal (LS_CS). The fourth terminal 114 of the power stage 106 is coupled to the terminal 144 of the load 142 and provides VOUT. The first terminal of COUT is also coupled to the fourth terminal 114 of the power stage 106 and the terminal 144 of the load 142. The second terminal of COUT is coupled to a ground terminal. The fifth terminal 116 of the power stage 106 is coupled to the second terminal 150 of the controller 148 and provides a switch node voltage ($V_{SW}$) at switch node 135. The ground terminal 118 of the power stage 106, the ground terminal 154 of the controller 148, and the ground terminal 146 of the load 142 are coupled to ground.

As shown, the first terminal 122 of the HS switch 120 is coupled to the first terminal 108 of the power stage 106. The second terminal 124 of the HS switch 120 is coupled to the first terminal 130 of the LS switch 128 and to the first terminal 138 of the inductor 136. The control terminal 126 of the HS switch 120 is coupled to the second terminal 110 of the power stage 106. The second terminal 132 of the LS switch 128 is coupled to the ground terminal 118 of the power stage 106. The control terminal 134 of the LS switch 128 is coupled to the third terminal 112 of the power stage 106. As shown, the fifth terminal 116 of the power stage 106 is coupled second terminal 124 of the HS switch 120, the first terminal 130 of the LS switch 128, and the first terminal 138 of the inductor 136. The second terminal 140 of the inductor 136 is coupled to the fourth terminal 114 of the power stage 106. In the example of FIG. 1, the second terminal 124 of the HS switch 120, the first terminal 130 of the LS switch 128, and the first terminal 138 of the inductor 136 are coupled to a switch node 135 between the HS switch 120 and the LS switch 128.

As shown, the input(s) 156 of the valley control circuitry 155 receive control signal(s) CS1. In some examples, CS1 includes a valley threshold and an inductor current sense signal. In some examples, the valley threshold and/or the inductor current sense signal are ramped. The input(s) 160 of the peak control circuitry 158 receive control signal(s) CS2. In some examples, CS2 includes a peak threshold and an inductor current sense signal. The first terminal(s) 166 of the adaptive PFM timer circuit 164 receive control signal(s) CS3. In some examples, CS3 includes a control voltage (e.g., V_CTRL herein), a digital control signal, and switch control signals. In some examples, V_CTRL is the error result between VOUT and a reference voltage (VREF). In some examples, the digital control signal and the switch control signals are provided by the mode control logic 170. For example, the digital control signal and the switch control signals may be included in the control signals CS4 provided by the mode control logic 170.

The first terminal 172 of the mode control logic 170 is coupled to the output 157 of the valley control circuitry 155. The second terminal 174 of the mode control logic 170 is coupled to the output 162 of the peak control circuitry 158. The third terminal 176 of the mode control logic 170 is coupled to the second terminal 168 of the adaptive PFM timer circuit 164. The fifth terminal 180 of the mode control logic 170 is coupled to the first terminal 186 of the driver circuitry 184. The sixth terminal 182 of the mode control logic 170 is coupled to the second terminal 188 of the driver circuitry 184. The third terminal 190 of the driver circuitry 184 is coupled to the fourth terminal 152 of the controller 148. The fourth terminal 192 of the driver circuitry 184 is coupled to the fifth terminal 153 of the controller 148.

In operation, the controller 148 is configured to: receive VIN at its first terminal 149; receive $V_{SW}$ at its second terminal 150; receive VOUT at its third terminal 151; provide HS_CS at its fourth terminal 152 responsive to VIN, $V_{SW}$, VOUT, and the operations of the valley control circuitry 155, the peak control circuitry 158, the adaptive PFM timer circuit 164, the mode control logic 170, and the driver circuitry 184; and provide LS_CS at its fifth terminal 153 responsive to VIN, $V_{SW}$, VOUT, and the operations of the valley control circuitry 155, the peak control circuitry 158, the adaptive PFM timer circuit 164, the mode control logic 170, and the driver circuitry 184. In some examples, example modes supported by the controller 148 include a pulse-width modulation (PWM) mode and a PFM mode. In some examples, transitions from the PWM mode to the PFM mode are based on the controller 148 is configured to: identify a PFM mode trigger; provide adaptation control signals (e.g., CS4 or related control signals) to the adaptive PFM timer circuit 164 responsive to the PFM mode trigger; monitor adaptation results of the adaptive PFM timer circuit 164 responsive to the adaptation control signals; and transition to a PFM mode responsive to the adaptation results indicating PFM timing is ready.

In operation, the power stage 106 is configured to: receive VIN at its first terminal 108; receive HS_CS at its second terminal 110; receive LS_CS at its third terminal 112; provide VOUT at its fourth terminal 114 responsive to VIN, HS_CS, and LS_CS; provide $V_{SW}$ at its fifth terminal 116 responsive to VIN, HS_CS, and LS_CS; and provide a coupling between the ground terminal 118 and ground. More specifically, the HS switch 120 couples VIN to the switch node 135 responsive to HS_CS, which increases the current in the inductor 136. The LS switch 128 couples the ground terminal 118 to the switch node 135 responsive to LS_CS, which decreases the current in the inductor 136. The average current in the inductor 136 is considered the load current provided to the load 142. In some examples, VIN may be 2.5 V to 40 V, VOUT may be 0.3 V to 6 V. In some examples, I_out may be 0 to 1 A during PFM mode. During PWM mode, I_out may be 0 to 10 A.

Example modes supported by the controller 148 include a pulse-width modulation (PWM) mode and a PFM mode. In some examples, transitions from PWM mode to PFM mode are based on: identifying a PFM mode trigger (e.g., a light-load condition or a low-power mode signal); provide adaptation control signals (e.g., CS4 or related control signals) to the adaptive PFM timer circuit 164 responsive to the PFM mode trigger; monitor adaptation results of the adaptive PFM timer circuit 164 responsive to the adaptation control signals; and transition to the PFM mode responsive to the adaptation results indicating PFM timing is aligned with a target PFM timing. In some examples, PFM timing is adapted so that the PFM timer period matches the PWM switching period for PFM mode entry. After PFM mode entry, PFM timing is adjusted as needed responsive to the load current. In some examples, the PFM mode may keep the last value of the multi-bit digital control signal for the adaptive PFM timer circuit 164 at the time of transition to PFM mode and use V_CTRL to adjust the PFM timing as needed. In some examples, the adaptive PFM timer circuit 164 includes a digital-to-analog converter (DAC) to generate a current source control signal responsive to the digital multi-bit digital control signal. The current source control signal is used to adjust an offset current of the adaptive PFM timer circuit 164, which affects the rate at which a capacitor (e.g., C_pfm herein) is charged. In some examples, the multi-bit digital control signal has 6 bits (e.g., Sel_pfm_timer<5:0> herein).

Figures 2A, 2B:
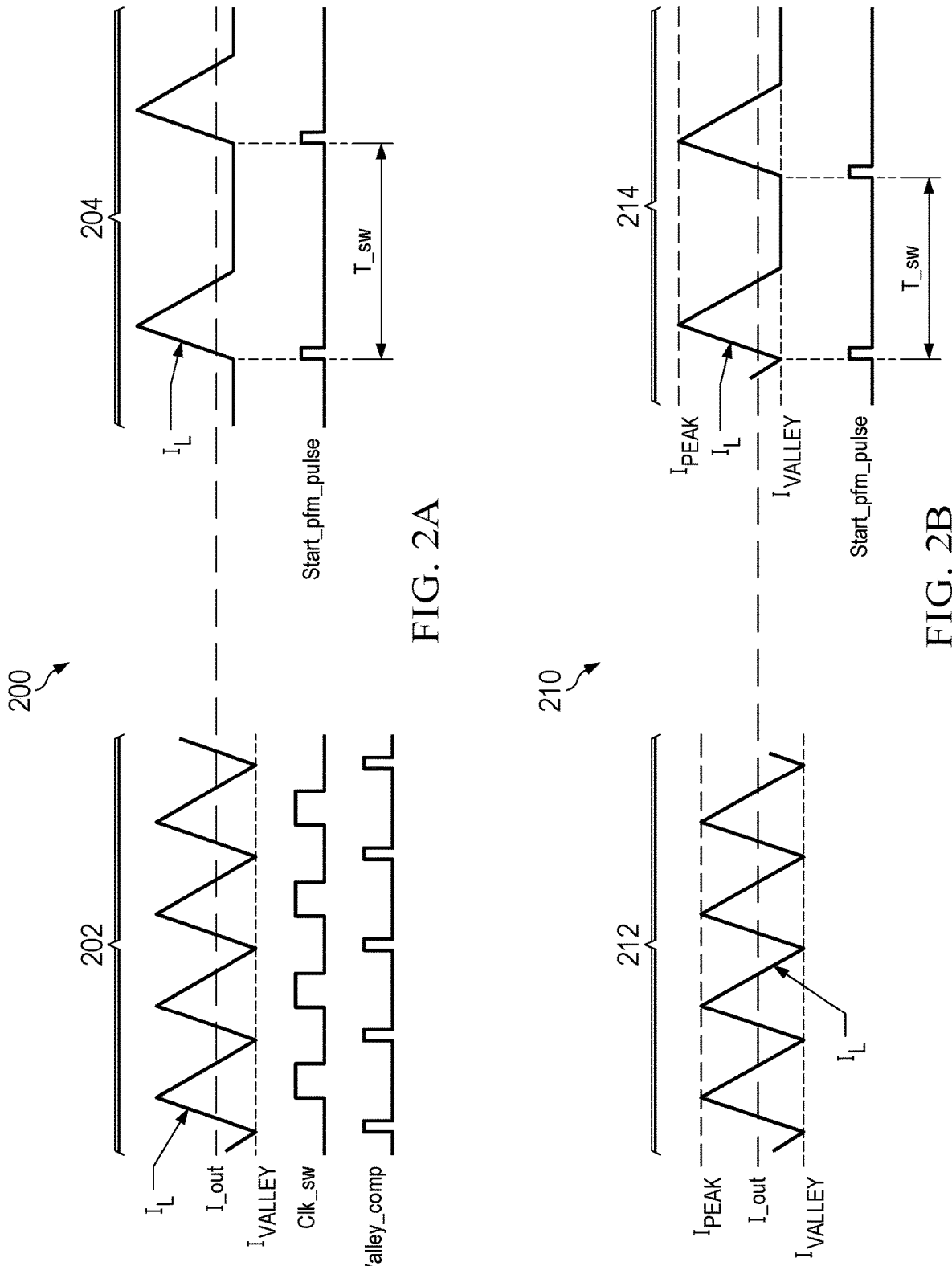
FIGS. 2A to 2C are diagrams showing example waveforms and thresholds for different modes of a switching converter controller.
Figures 2C, 3:
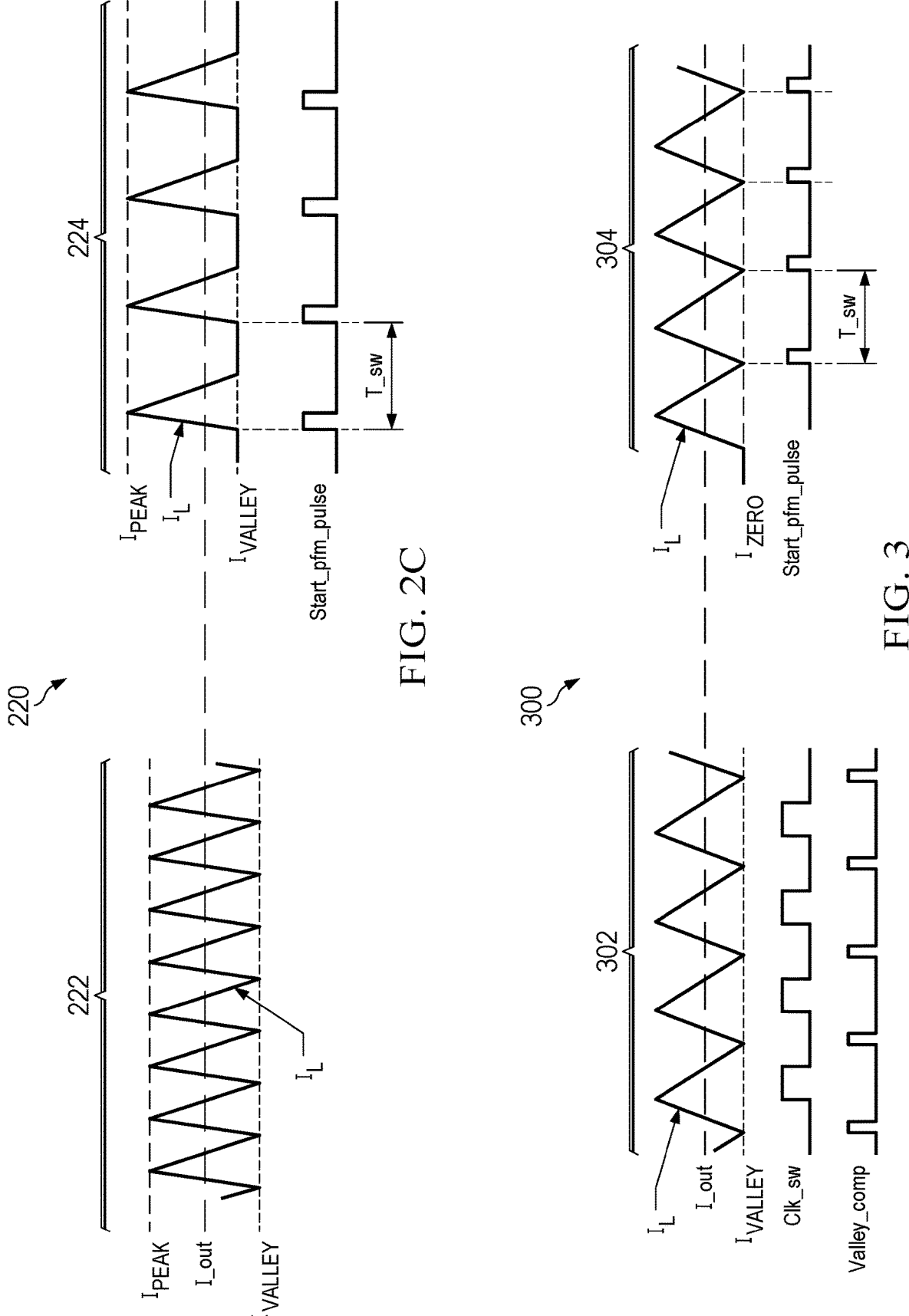
FIG. 3 is another diagram showing example waveforms and thresholds for different modes of a switching converter controller.

FIGS. 2A to 2C are diagrams 200, 210, and 220 showing example waveforms and thresholds for different modes of a switching converter controller. In some examples, the switching converter controller is a current mode buck converter controller with a PFM timer. In the diagram 200 of FIG. 2A, example waveforms and thresholds are shown for a PWM mode interval 202 and a PFM mode interval 204. The waveforms and thresholds for the PWM mode interval 202 include inductor current ($I_L$), output current (I_out), a valley current threshold ($I_{VALLEY}$), a switching clock signal (Clk_sw), and a valley compare result (Valley_comp). During the PWM mode interval 202, IL ramps up (e.g., during a HS interval in which the HS switch 120 turned on) until Clk_sw is asserted. IL subsequently ramps down (e.g., during an LS interval in which the LS switch 128 turned on) until reaching $I_{VALLEY}$. Each time IL reaches $I_{VALLEY}$, Valley_comp is asserted, which ends an LS interval and starts a subsequent HS interval. With the waveforms and thresholds of the PWM mode interval 202 an average I_out is maintained. As desired, control parameters related to IL may be adjusted to increase or decrease I_out.

The waveforms and thresholds for the PFM mode interval 204 include $I_L$, I_out, a PFM timing signal (Start_pfm_pulse), and a PFM switching period (T_sw). During the PFM mode interval 204, IL ramps up and down responsive to a peak limit detection, a peak limit timer, zero current detection, a PFM timer interval (e.g., T_sw herein), and/or a PFM pulse start signal (e.g., Start_pfm_pulse). In some examples, when IL reaches a peak current threshold (e.g., $I_{PEAK}$ herein) or when a timer threshold is reached, a low-side interval starts and causes IL to ramp down. When IL reaches a zero current threshold (e.g., $I_{ZERO}$ herein), a pause interval starts. The pause interval ends responsive to the PFM timer interval (e.g., T_sw herein) and/or a related control signal (e.g., Start_pfm_pulse herein), which triggers a high-side interval. During the high-side interval, IL ramps up. During the PFM mode interval 204, the spacing between PFM pulses during the PFM mode interval 204 is controlled by T_sw. In some examples, T_sw may be adjusted by the PFM timer.

In the example of FIG. 2A, the PFM pulse peak may be based on the inductor current ripple in the PWM mode interval 202. One option is to control the output current in the PWM mode interval 202 and the PFM mode interval 204 based on V_CTRL. With this option, V_CTRL may control the valley current level in PWM mode interval 202 and T_sw in the PFM mode interval 204. In the PFM mode interval 204, the PFM pulse width and T_sw affects I_out. In some examples, $$I_{out} = I_{valley} + \frac{I_{ripple}}{2}$$

for the PWM mode interval 202, while $$I_{out} = \frac{I_{peak}}{2} * \frac{T_{pulse\_width}}{T_{SW}}$$

for the PFM mode interval 204.

When transitioning to the PFM mode interval 204, mismatch in I_out for the PWM mode interval 202 and the PFM mode interval 204 can cause VOUT undershoot, overshoot and/or mode bouncing. I_out mismatches for the PWM mode interval 202 and the PFM mode interval 204 may be caused by: use of V_CTRL for control of both modes; PFM timer offsets causing variations in $T_{sw}$; and/or inductor value variance (e.g., inductors may have a tolerance of +/-30%) causing variations in the width of the PFM pulse.

In the diagram 210 of FIG. 2B, example waveforms and thresholds are shown for a PWM mode interval 212 and a PFM mode interval 214. The waveforms and thresholds for the PWM mode interval 212 include $I_L$, I_out, $I_{VALLEY}$, and a peak current threshold ($I_{PEAK}$). The waveforms and thresholds for the PFM mode interval 214 include $I_L$, I_out, $I_{VALLEY}$, $I_{PEAK}$, Start_pfm_pulse, and T_sw. In the diagram 210, a slow frequency, high inductance scenario is represented.

In the diagram 220 of FIG. 2C, example waveforms and thresholds are shown for a PWM mode interval 222 and a PFM mode interval 224. The waveforms and thresholds for the PWM mode interval 222 include $I_L$, I_out, $I_{VALLEY}$, and $I_{PEAK}$. The waveforms and thresholds for the PFM mode interval 214 include $I_L$, I_out, $I_{VALLEY}$, $I_{PEAK}$, Start_pfm_pulse, and T_sw. In the diagram 220, a fast frequency, low inductance scenario is represented. For the diagrams 210 and 220, the same load, the same $I_{VALLEY}$ levels, and the same $I_{PEAK}$ levels are assumed. However, the PFM timer needs to operate with different values of T_sw for the PFM mode intervals 214 and 224 even through the $I_{PEAK}$ levels are equal. Also, the PFM pulse width for the PFM mode interval 214 may vary from the PFM pulse width for the PFM mode interval 224 depending on duty ratio, switching frequency, and inductance. Without PFM timer tuning for different scenarios as described herein (e.g., the slow frequency, high inductance scenario of the diagram 210 versus the fast frequency, low inductance scenario of the diagram 220) VOUT may undershoot, may undershoot, and/or may cause mode bounce.

FIG. 3 is another diagram 300 showing example inductor current, thresholds, and control signals for different modes of a switching converter controller. In the diagram 300 of FIG. 3, example waveforms and thresholds are shown for a PWM mode 302 and a PFM mode 304. The waveforms and thresholds for the PWM mode 302 include $I_L$, I_out, $I_{VALLEY}$, Clk_sw, and Valley_comp. The waveforms and thresholds for the PFM mode 304 include $I_L$, I_out, a zero current threshold ($I_{ZERO}$), Start_pfm_pulse, and $T_{sw}$.

For the diagram 300, an adaptive PFM timer (e.g., the adaptive PFM timer circuit 164 in FIG. 1) is used. In some examples, an adaptive PFM timer operates to adjust an offset current of the adaptive PFM timer responsive to a digital control signal. In some examples, the digital control signal is based on a PFM pulse width before entering the PFM mode 304. In some examples, a voltage related to $I_{ZERO}$ (the voltage given as "V_valley_zero" herein) is muxed to an input of the adaptive PFM timer to adjust the offset current. In some examples, V_valley_zero generates the same I_out in the PWM mode 302 and the PFM mode 304. In some examples, V_valley_zero may equal the V_CTRL value that results in I_ZERO level in the PWM mode 302. In such examples, V_valley_zero may generate consecutive PFM pulses in the PFM mode 304, where the PFM pulse size is adapted based on the PWM current ripple. In some examples, the digital control signal to the adaptive PFM timer is adjusted so that the offset current of the adaptive PFM timer results in a PFM timing period (T_sw) that matches with the PWM switching period (the period of Valley_comp). In some examples, mode control logic may compare the PWM switching period to PFM timer period. Based on the comparison, the digital control signal may be adjusted every second switching cycle. If the PFM timer period is shorter than PWM switching period, the digital control signal is adjusted to increase the offset current of the adaptive PFM timer. If the PFM timer period is longer than PWM switching period, the digital control signal is adjusted to decrease the offset current which steps the DAC downwards to decrease the offset current of the adaptive PFM timer.

Figure 4:
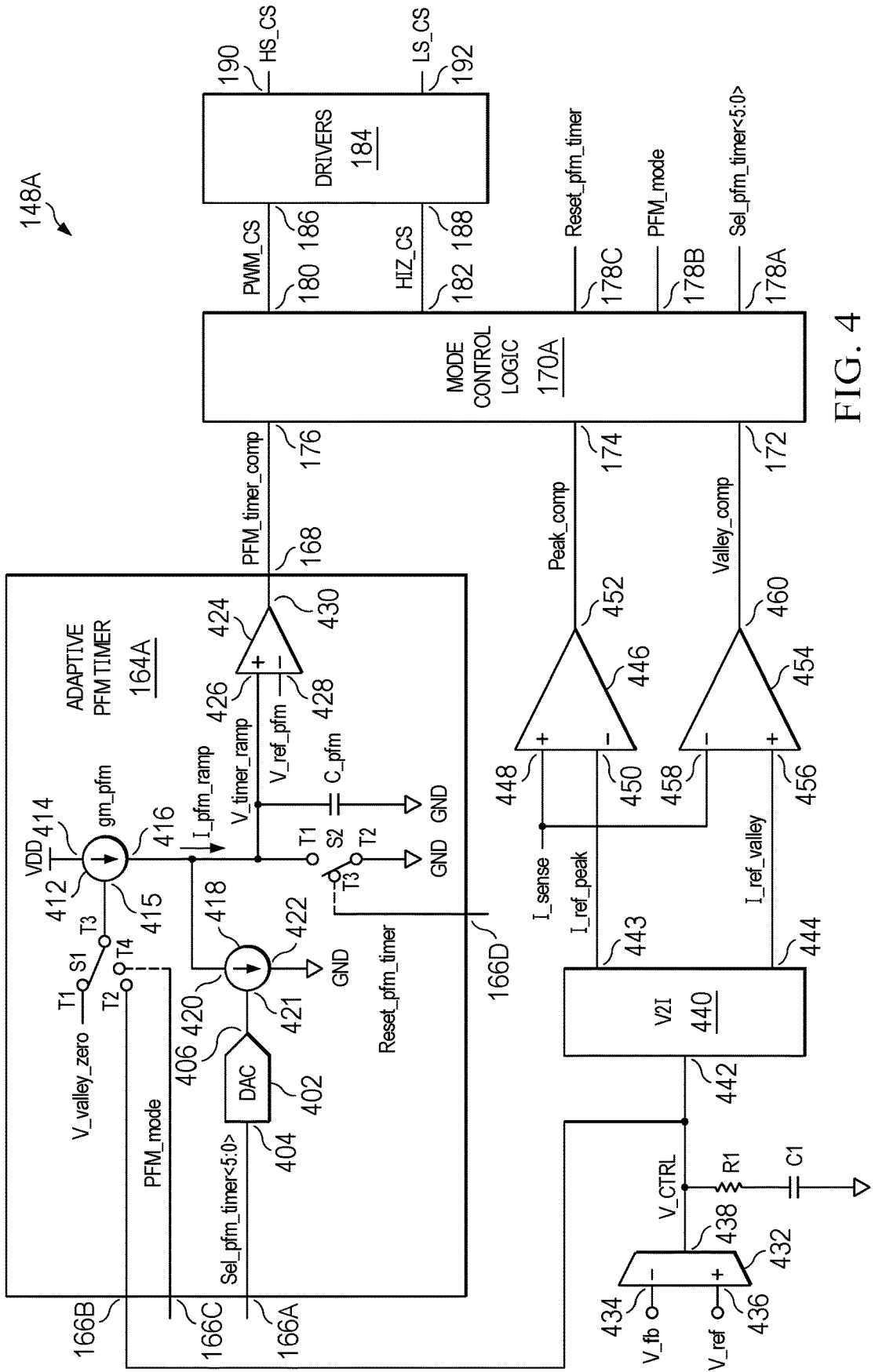
FIG. 4 is a diagram showing example components of a switching converter controller.

FIG. 4 is a diagram showing example components of a switching converter controller 148A. The switching converter controller 148A is an example of the controller 148 in FIG. 1. As shown, the switching converter controller 148A includes an adaptive PFM timer circuit 164A, an error amplifier 432, a resistor R1, a capacitor C1, a voltage-to-current converter 440, a peak comparator 446, a valley comparator 454, mode control logic 170A, and the driver circuitry 184. The adaptive PFM timer circuit 164A is an example of the adaptive PFM timer circuit 164 in FIG. 1. In the example of FIG. 4, the error amplifier 432, the voltage-to-current converter 440, and the peak comparator 446 are example components of the peak control circuitry 158 in FIG. 1. The error amplifier 432, the voltage-to-current converter 440, and the valley comparator 454 are example components of the valley control circuitry 155 in FIG. 1.

The error amplifier 432 has a first (inverting or "−") terminal 434, a second (non-inverting or "+") terminal 436, and a third terminal 438. The voltage-to-current converter 440 has a first terminal 442, a second terminal 443, and a third terminal 444. The peak comparator 446 has a first (non-inverting or "+") terminal 448, a second (inverting or "−") terminal 450, and a third terminal 452. The valley comparator 454 has a first (non-inverting or "+") terminal 456, a second (inverting or "−") terminal 458, and a third terminal 460. The mode control logic 170A has the first terminal 172, the second terminal 174, the third terminal 176, fourth terminals 178A to 178C, the fifth terminal 180, and the sixth terminal 182. In the example of FIG. 4, each of the fourth terminals 178A to 178C is an example of the fourth terminal 178 in FIG. 1. The driver circuitry 184 has the first terminal 186, the second terminal 188, the third terminal 190, and the fourth terminal 192 described in FIG. 1.

In the example of FIG. 4, the adaptive PFM timer circuit 164A has first terminals 166A, 166B, 166C, and 166D, and the second terminal 168. Each of the first terminals 166A, 166B, 166C, and 166D are examples of the first terminal(s) 166 in FIG. 1. As shown, the adaptive PFM timer circuit 164A includes a digital-to-analog converter (DAC) 402, a first switch S1, a first current source 412, a second current source 418, a second switch S2, a capacitor C_pfm, and a comparator 424. The DAC 402 has a first terminal 404 and a second terminal 406. The first switch S1 has a first terminal T1, a second terminal T2, a third terminal T3, and a fourth terminal T4. The first current source 412 has a first terminal 414, a second terminal 415, and a third terminal 416. The second current source 418 has a first terminal 420, a second terminal 421, and a third terminal 422. The second switch S2 has a first terminal T1, a second terminal T2, and a third terminal T3. The capacitor C_pfm has a first terminal and a second terminal. The comparator 424 has a first (e.g., a non-inverting or "+") terminal 426, a second (e.g., an inverting or "−") terminal 428, and a third terminal 430.

In the example of FIG. 4, the first terminal 404 of the DAC 402 is coupled to the first terminal 166A of the adaptive PFM timer circuit 164A. The second terminal 406 of the DAC 402 is coupled to the second terminal 421 of the second current source 418. The first terminal T1 of the first switch S1 is coupled to a zero valley reference source (not shown) and receives V_valley_zero. The second terminal T2 of the first switch S1 is coupled to the first terminal 166B of the adaptive PFM timer circuit 164A. The third terminal T3 of the first switch S1 is coupled to the second terminal 415 of the first current source 412. The fourth terminal T4 of the first switch S1 is coupled to the first terminal 166C of the adaptive PFM timer circuit 164A. The first terminal 414 of the first current source 412 is coupled to a source voltage (VDD) terminal. The third terminal 416 of the first current source 412 is coupled to the first terminal 420 of the second current source 418. The third terminal 416 of the first current source 412 is also coupled to first terminal T1 of the second switch S2, to the first terminal of the capacitor C_pfm, and to the first terminal 426 of the comparator 424. The second terminal T2 of the second switch S2 is coupled to ground or a ground terminal. The third terminal T3 of the second switch S2 is coupled to the first terminal 166D of the adaptive PFM timer circuit 164A. The second terminal of the capacitor C_pfm is coupled to ground or a ground terminal. The second terminal 428 of the comparator 424 is coupled to a reference voltage source (not shown) and receives a PFM reference voltage (V_ref_pfm). The third terminal 430 of the comparator 424 is coupled to the second terminal 168 of the adaptive PFM timer circuit 164A.

The first terminal 434 of the error amplifier 432 is coupled to an output terminal of a power stage (e.g., the fourth terminal 114 in FIG. 1) and receives VOUT as a feedback voltage (V_fb). As another option, V_fb may be scaled version of VOUT (e.g., using a voltage divider). The second terminal 436 of the error amplifier 432 is coupled to a reference voltage source (not shown) and receives a reference voltage (V_ref). The third terminal 438 of the error amplifier 432 is coupled to the first terminal of the resistor R1 and to the first terminal 442 of the voltage-to-current converter 440. The second terminal of the resistor R1 is coupled to the first terminal of the capacitor C1. The second terminal of the capacitor C1 is coupled to ground or a ground terminal. The second terminal 443 of the voltage-to-current converter 440 is coupled to the second terminal 450 of the peak comparator 446. The first terminal 448 of the peak comparator 446 is coupled to a sense current (I_sense) source. An example I_sense source is the fifth terminal 116 of the power stage 106 in FIG. 1 or related sense circuitry configured to monitor $V_{SW}$ or a related current. The third terminal 444 of the voltage-to-current converter 440 is coupled to the first terminal 456 of the valley comparator 454. The second terminal 458 of the valley comparator 454 is coupled to the I_sense source (not shown).

The first terminal 172 of the mode control logic 170A is coupled to third terminal 460 of the valley comparator 454. The second terminal 174 of the mode control logic 170A is coupled to the third terminal 452 of the peak comparator 446. The third terminal 176 of the mode control logic 170A is coupled to the second terminal 168 of the adaptive PFM timer circuit 164A. The fourth terminal 178A of the mode control logic 170A is coupled to the first terminal 166A of the adaptive PFM timer circuit 164A. The fourth terminal 178B of the mode control logic 170A is coupled to the first terminal 166C of the adaptive PFM timer circuit 164A. The first terminal 166B of the adaptive PFM timer circuit 164A is coupled to the third terminal 438 of the error amplifier 432 and receives a control voltage (V_CTRL). The fourth terminal 178C of the mode control logic 170A is coupled to the first terminal 166D of the adaptive PFM timer circuit 164A. The fifth terminal 180 of the mode control logic 170A is coupled to the first terminal 186 of the driver circuitry 184. The sixth terminal 182 of the mode control logic 170A is coupled to the second terminal 188 of the driver circuitry 184. The third terminal 190 of the driver circuitry 184 is a coupled to a control terminal of a first switch (e.g., the high-side switch HS_SW in FIG. 1). The fourth terminal 192 of the driver circuitry 184 is a coupled to a control terminal of a second switch (e.g., the low-side switch LS_SW in FIG. 1).

The error amplifier 432 is configured to: receive V_fb at the first terminal 434; receive V_ref at the second terminal 436; and provide V_CTRL at the third terminal 438 responsive to V_fb and V_ref. The value of V_CTRL is based on the difference between V_fb and V_ref as well as the value of the resistor R1 and the value of the capacitor C1, which form compensation circuitry for the control loop. Specifically, R1 and C1 convert error amplifier current to voltage based on proportional integrator (PI) control. The transconductance of the error amplifier 432 defines the gain applied when converting the voltage error at the input of the error amplifier 432 to an output current. The voltage-to-current converter 440 is configured to: receive V_CTRL at the first terminal 442; provide a peak reference current (I_ref_peak) at the second terminal 443 responsive to V_CTRL; and provide a valley reference current (I_ref_valley) at the third terminal 444 responsive to V_CTRL. In some examples, voltage-to-current converter 440 converts V_CTRL to I_ref_valley based on a given transconductance in the PWM mode. If the PFM mode, the voltage-to-current converter 440 sets I_ref_valley to zero. In some examples, the voltage-to-current converter 440 may convert V_CTRL to I_ref_peak using the given transconductance. In some examples, the voltage-to-current converter 440 I_ref_valley and/or I_ref_peak generation is also based on a hysteresis current, which defines the difference between the valley and peak levels. In the PWM mode, the hysteresis current may be a predefined value (e.g., relative to a fixed current level). In the PFM mode, the hysteresis current may be relative to the inductor current ripple in the PWM mode.

The peak comparator 446 is configured to: receive I_sense at the first terminal 448; receive I_ref_peak at the second terminal 450; and provide a peak compare result (Peak_comp) at the third terminal 452 responsive to I_sense and I_ref_peak. The valley comparator 454 is configured to: receive I_ref_peak at the first (non-inverting) terminal 456; receive I_sense at the second (inverting) terminal 458; and provide a comparison result Valley_comp at the third terminal 460 responsive to I_sense and I_ref_valley.

The adaptive PFM timer circuit 164A is configured to: receive a digital control signal Sel_pfm_timer<5:0> at the first terminal 166A; receive V_CTRL at the first terminal 166B; receive a PFM mode signal (PFM_mode) at the first terminal 166C; receive a reset signal (Reset_pfm_timer) at the first terminal 166D; and provide a PFM timer result (PFM_timer_comp) at the second terminal 168 responsive to Sel_pfm_timer<5:0>, V_CTRL, PFM_mode, and Reset_pfm_timer. In some examples, Start_pfm_pulse in FIGS. 2A, 2B, and 2C may be based on PFM_timer_comp being aligned with a target PFM timing as described herein. In some examples, Start_pfm_pulse may be delayed relative to PFM_timer_comp. For example, once PFM_timer_comp triggers, Start_pfm_pulse may not trigger until a next low-side interval ends or pause interval begins.

The mode control logic 170A is configured to: receive Valley_comp at the first terminal 172; receive Peak_comp at the second terminal 174; receive PFM_timer_comp at the third terminal 176; provide Sel_pfm_timer<5:0> at the fourth terminal 178A to perform offset current adaptation operations for the adaptive PFM timer circuit 164A responsive to a light load condition; provide PFM_mode at the fourth terminal 178B responsive to adaptation operations of the adaptive PFM timer circuit 164A being complete to indicate the PFM mode has started; provide Reset_pfm_timer at the fourth terminal 178C during the offset current adaptation operations (e.g., every other PWM_CS cycle); control a PWM control signal (PWM_CS) state at the fifth terminal 180 responsive to Valley_comp, Peak_comp, a clock signal (e.g., Clk_sw in FIG. 5), PFM_timer_comp, and/or a current mode; and provide a high impedance (HIZ) control signal (HIZ_CS) at the sixth terminal 182 responsive to Valley_comp, Peak_comp, PFM_timer_comp and/or the current mode (e.g., PWM mode or PFM mode).

In some examples, the mode control logic 170A is configured to control the state of PWM_CS at the fifth terminal 180 and the state of HIZ_CS at the sixth terminal 182 during PWM mode operations and during PFM mode operations of the switching converter controller 148A. In some examples, during a PWM mode, the mode control logic 170A is configured to maintain HIZ_CS in a second state (e.g., a de-asserted or logical low state). With HIZ_CS in the second state, PWM_CS controls the state of HS_CS and LS_CS during the PWM mode to support HS intervals and LS intervals. During the PWM mode, PWM_CS may be asserted responsive to Valley_comp being asserted (indicating the current of the inductor 136 has reached a valley threshold) and may be de-asserted responsive to a timer or clock signal (e.g., Clk_sw in FIG. 5) or responsive to Peak_comp being asserted (indicating the current of the inductor 136 has reached a peak threshold). For each HS interval, HS_CS may be asserted while LS_CS is de-asserted. For each LS interval, HS_CS may be de-asserted while LS_CS is asserted. The duration of the HS interval relative to the LS interval for each cycle defines a duty cycle provided by the switching converter controller 148A. For example, if the HS interval and the LS interval are equal in duration, the duty cycle provided by the switching converter controller 148A is 50%.

In response to a light load condition, the mode control logic 170A is configured to transition from the PWM mode to a PFM mode. To initiate transition from the PWM mode to the PFM mode, a light load condition is detected or a low-power mode control signal is received. During the transition interval, the mode control logic 170A is configured to provide and adjust Sel_pfm_timer<5:0> at the fourth terminal 178 to adjust the offset current of the adaptive PFM timer circuit 164A until assertion of PFM_timer_comp is aligned with the timing of PWM_CS, indicating the adaptive PFM timer circuit 164A is ready for the PFM mode. As part of the offset current adjustment or adaptation, the mode control logic 170A may assert Reset_pfm_timer every other cycle of PWM_CS. Once offset current adjustment or adaptation is complete (e.g., when PFM_timer_comp is aligned with a target), the mode control logic 170A asserts PFM_mode at the fourth terminal 178B and PFM mode operations begin. Example PFM mode operations include controlling PFM pulse timing based on V_CTRL and last value for Sel_pfm_timer<5:0> used during adaptation, controlling timing of HS intervals and LS intervals (ramp up time and ramp down time of $I_L$), and asserting HIZ_CS as needed to provide a pause between HS intervals and LS intervals during the PFM mode.

Responsive to detecting a light load condition, the mode control logic 170 initiates a transition from the PWM to a PFM mode. In some examples, the light load condition may be detected using a comparator (not shown) to detect when V_CTRL drops below V_valley_zero (indicating the valley current level is below zero). As another option, a host system may provide a control signal (e.g., a low-power mode control signal) that triggers a transition from the PWM mode to the PFM mode. During the transition interval, the adaptive PFM timer circuit 164A is configured to: receive Sel_pfm_timer<5:0> at the first terminal 166A; receive PFM_mode at the first terminal 166C; provide a current used to charge the capacitor C_pfm of the adaptive PFM timer circuit 164A responsive to a zero valley reference voltage (V_valley_zero); adjust the current responsive to Sel_pfm_timer<5:0> and a related offset current; and assert PFM_timer_comp at the second terminal 168 responsive to the charge level (V_timer_ramp) of the capacitor C_pfm becoming greater than V_ref_pfm.

More specifically, during the PWM mode (e.g., PFM_mode de-asserted) the first switch S1 is controlled so that V_valley_zero is provided to the first current source 412. The first current source 412 provides a current to charge the capacitor C_pfm based on V_valley_zero. The DAC 402 provides a control signal to the second current source 418 responsive to Sel_pfm_timer<5:0>. The second current source 418 provides an offset current responsive to the control signal from the DAC 402. The offset current provided by the second current source 418 adjusts the current provided by the first current source 412. The adjusted current (I_pfm_ramp) is used to charge the capacitor C_pfm. Once the charge level (V_timer_ramp) of the capacitor C_pfm becomes greater than V_ref_pfm, the comparator 424 asserts PFM_timer_comp at the second terminal 168.

Once PFM_timer_comp is aligned with a target, the mode control logic 170A de-asserts pfm_entry_adaptation and asserts PFM_mode to start PFM mode operations. During the PFM mode (e.g., PFM_mode asserted), the first switch S1 is controlled so that V_CTRL is provided to the first current source 412. Thus, during the PFM mode, the first current source 412 provides a current to charge the capacitor C_pfm based on V_CTRL. In some examples, during the PFM mode, Sel_pfm_timer<5:0> may maintain the adaptation result value (setting the offset current to a fixed value), while V_CTRL varies the current from the first current source 412 to charge the capacitor C_pfm. Once the charge level (V_timer_ramp) of the capacitor C_pfm becomes greater than V_ref_pfm, the comparator 424 asserts PFM_timer_comp at the second terminal 168. When PFM_timer_comp is asserted, a next PFM pulse of the PFM mode is triggered. After PFM_timer_comp is asserted, the second switch S2 may reset the charge on the capacitor C_pfm responsive to Reset_pfm_timer.

In some examples, the adaptive PFM timer circuit 164A selects between V_valley_zero and V_CTR using the first switch S1. With V_valley_zero, the PFM mode is initiated with same output current as the PWM mode. In some examples, V_valley_zero equals V_CTRL when there is a zero valley current level in the PWM mode. V_valley_zero may generate consecutive PFM pulses in PFM mode when the PFM pulse size is adapted based on the PWM current ripple. The mode control logic 160A provides a digital signal (Sel_pfm_timer<5:0>) to select the offset current used to adjust the current of the adaptive PFM timer circuit 164A. Again, the offset current is used to adjust I_pfm_ramp until the PFM timer period provided by the adaptive PFM timer circuit 164A is aligned with the PWM switching period.

In some examples, the mode control logic 170A is configured to compare the PWM switching period to the PFM timer period and adjust the digital signal to the DAC 402 every second switching cycle. If the PFM timer period is shorter than PWM switching period, the digital signal increases the output of the DAC 402 to increase the offset current. With an increased offset current, I_pfm_ramp is reduced, charging of the capacitor C_pfm is slower, and the PFM timer period increases. If the PFM timer period is longer than the PWM switching period, the digital signal decreases the output of the DAC 402 to decrease the offset current. With a decreased offset current, I_pfm_ramp is increased, charging of the capacitor C_pfm is faster, and the PFM timer period decreases.

During a PFM mode, the mode control logic 170A is configured to assert HIZ_CS as needed between PFM pulses to enable pause intervals (e.g., both of the HS switch 120 and the LS switch 128 are turned off during each pause interval) between HS intervals and LS intervals. Also, during the PFM mode, PFM_pulse_comp may be asserted to initiate a PFM pulse (a HS interval) when HIZ_CS is de-asserted and PWM_CS is asserted. During the PFM mode, Peak_comp being asserted may initiate an LS interval when PWM_CS is de-asserted. During the PFM mode, Valley_comp may be used to detect zero current and trigger assertion of HIZ_CS.

The driver circuitry 184 is configured to receive PWM_CS at the first terminal 186; receive HIZ_CS at the second terminal 188; provide HS_CS with a first state (e.g., HS_CS asserted) at the third terminal 190 and LS_CS with a second state (e.g., LS_CS de-asserted) at the fourth terminal 192 responsive to PWM_CS having a first state (e.g., PWM_CS asserted) and HIZ_CS having a second state (e.g., HIZ_CS de-asserted); provide HS_CS with a second state (e.g., HS_CS de-asserted) at the third terminal 190 and LS_CS with a first state (e.g., LS_CS asserted) at the fourth terminal 192 responsive to PWM_CS having a second state (e.g., PWM_CS de-asserted) and HIZ_CS having a second state (e.g., HIZ_CS de-asserted); and provide HS_CS with a second state (e.g., HS_CS de-asserted) at the third terminal 190 and LS_CS with a second state (e.g., LS_CS de-asserted) at the fourth terminal 192 responsive to HIZ_CS having a first state (e.g., HIZ_CS asserted).

Figure 5:
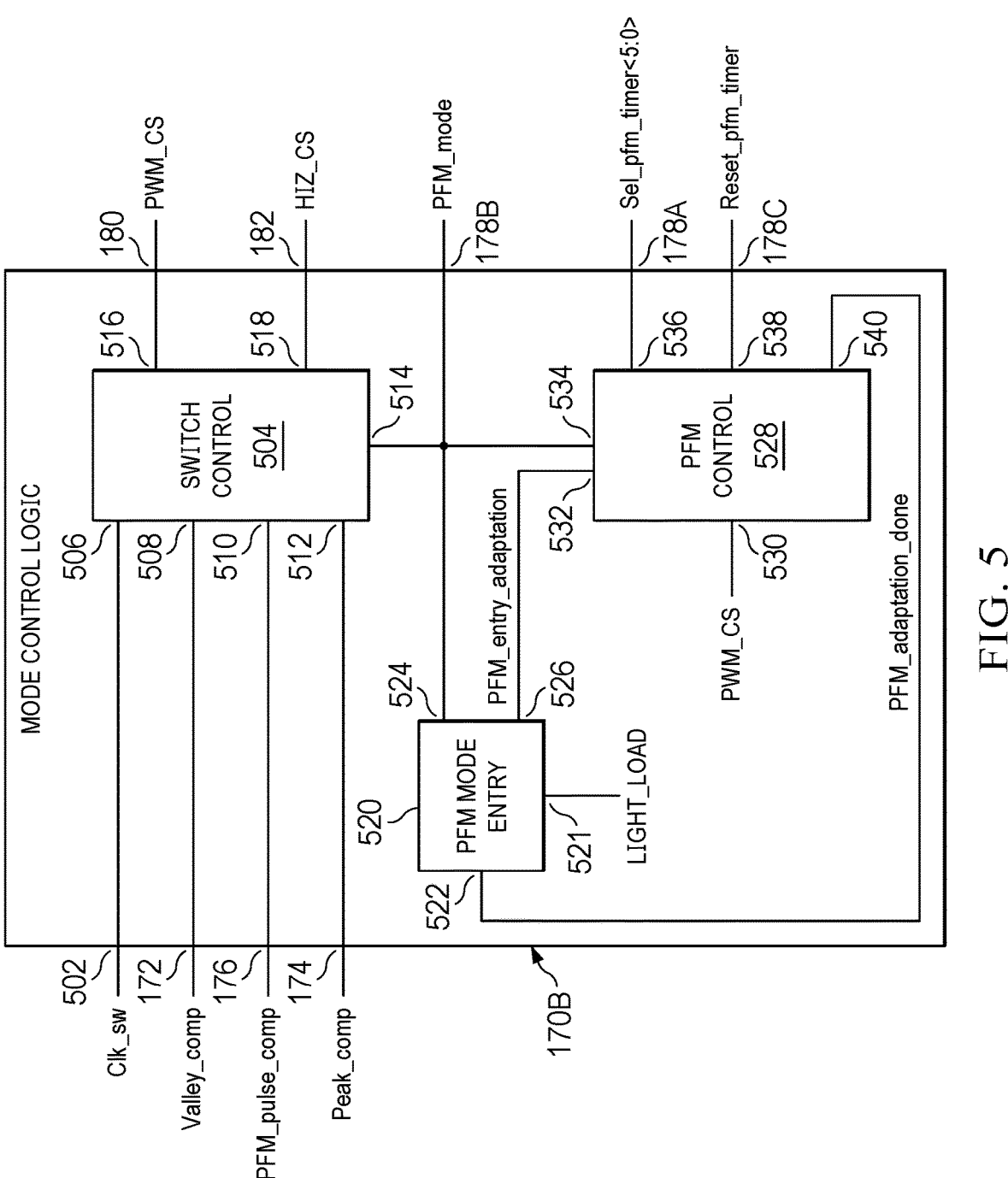
FIG. 5 is a diagram showing example mode control logic of a switching converter controller.

FIG. 5 is a diagram showing example mode control logic 170B of a switching converter controller (e.g., the controller 148 of FIG. 1, or the switching converter controller 148A in FIG. 4). The mode control logic 170B is an example of the mode control logic 170 in FIG. 1, or the mode control logic 170A in FIG. 4. As shown, the mode control logic 170B has the first terminal 172, the second terminal 174, the third terminal 176, the fourth terminal 178A, the fourth terminal 178B, the fourth terminal 178C, the fifth terminal 180, the sixth terminal 182, and a seventh terminal 502. The mode control logic 170B includes switch control circuitry 504, PFM mode entry circuitry 520, and PFM control circuitry 528. The switch control circuitry 504 has a first terminal 506, a second terminal 508, a third terminal 510, a fourth terminal 512, a fifth terminal 514, a sixth terminal 516, and a seventh terminal 518. The PFM mode entry circuitry 520 has a first terminal 521, a second terminal 522, a third terminal 524, and a fourth terminal 526. The PFM control circuitry 528 has a first terminal 530, a second terminal 532, a third terminal 534, a fourth terminal 536, a fifth terminal 538, and a sixth terminal 540.

In the example of FIG. 5, the first terminal 506 of the switch control circuitry 504 is coupled to the seventh terminal 502 of the mode control logic 170B. The second terminal 508 of the switch control circuitry 504 is coupled to the first terminal 172 of the mode control logic 170B. The third terminal 510 of the switch control circuitry 504 is coupled to the third terminal 176 of the mode control logic 170B. The fourth terminal 512 of the switch control circuitry 504 is coupled to the second terminal 174 of the mode control logic 170B. The fifth terminal 514 of the switch control circuitry 504 is coupled to the third terminal 524 of the PFM mode entry circuitry 520, the third terminal 534 of the PFM control circuitry 528, and to the fourth terminal 178B of the mode control logic 170B. The sixth terminal 516 of the switch control circuitry 504 is coupled to the fifth terminal 180 of the mode control logic 170B. The seventh terminal 518 of the switch control circuitry 504 is coupled to the sixth terminal 182 of the mode control logic 170B.

The first terminal 521 of the PFM mode entry circuitry 520 receives a light load condition signal (LIGHT_LOAD). In some examples, the state of LIGHT_LOAD is determined by detecting when IL or average IL drops below a threshold. As another option, a low-power request or trigger may be used to assert LIGHT_LOAD. The second terminal 522 of the PFM mode entry circuitry 520 is coupled to the fourth terminal 540 of the PFM control circuitry 528. The fourth terminal 526 is coupled to the second terminal 532 of the PFM control circuitry 528. The first terminal 530 of the PFM control circuitry 528 is coupled to the sixth terminal 516 of the switch control circuitry 504. The fourth terminal 536 of the PFM control circuitry 528 is coupled to the fourth terminal 178A of the mode control logic 170B. The fifth terminal 538 of the PFM control circuitry 528 is coupled to the fourth terminal 178C of the mode control logic 170B.

The PFM mode entry circuitry 520 is configured to: receive LIGHT_LOAD at the first terminal 521; receive a PFM adaptation complete signal (PFM_adaptation_done) at the second terminal 522; control the state of PFM_mode at the third terminal 524 responsive to LIGHT_LOAD and PFM_adaptation_done; control the state of a PFM adaptation control signal (PFM_entry_adaptation) at the fourth terminal 526 responsive to LIGHT_LOAD and PFM_adaptation_done. In some examples, PFM_entry_adaptation are asserted responsive to LIGHT_LOAD being asserted. PFM_entry_adaptation stays asserted during the transition interval until PFM_adaptation_done is asserted. Responsive to PFM_adaptation_done being asserted, indicating the PFM timer adaptation is complete and thus the transition interval is complete, the PFM mode entry circuitry 520 is configured to assert PFM_mode and de-assert PFM_entry_adaptation.

In some examples, the PFM control circuitry 528 is configured to adjust Sel_pfm_timer<5:0> at the fourth terminal 536 as needed while PFM_entry_adaptation is asserted to perform offset current adaptation operations of the adaptive PFM timer circuit 164A. During offset current adaptation, the PFM control circuitry 528 is configured to receive PWM_CS at the first terminal 530; and de-assert Reset_pfm_timer every second switching cycle based on PWM_CS (e.g., every other rising edge of PWM_CS). With Reset_pfm_timer de-asserted, the adaptive PFM timer circuit 164A charges the capacitor C_pfm and generates V_timer_ramp. Once V_timer_ramp reaches a reference level (V_ref_pfm), the comparator 424 asserts PFM_timer_comp before PWM_CS rises (the adaptive PFM timer circuit 164A operates faster than the PWM_CS period). During offset current adaptation, the PFM control circuitry 528 is configured to step up Sel_pfm_timer<5:0> to increase to the offset current, which decreases the current used to charge C_pfm (increasing the amount of time taken for V_timer_ramp to reach V_ref_pfm). If the comparator 424 does not trigger before PWM_CS rises, then the adaptive PFM timer circuit 164A operates slower than the PWM_CS period. In such case, the PFM control circuitry continues to step up Sel_pfm_timer<5:0> as needed until the adaptive PFM timer circuit 164A operates faster than the PWM_CS period. In some examples, offset current adaptation continues by adjusting Sel_pfm_timer<5:0> up and down as needed until the timing of the adaptive PFM timer circuit 164A is confirmed to closely approximate the timing of the PWM_CS period. Once the adaptation process is complete, the PFM control circuitry 528 is configured to assert PFM_adaptation_done, which causes the PFM mode entry circuitry 520 to end the transition or adaptation interval (e.g., by de-asserting PFM_entry_adaptation and asserting PFM_mode) and begin PFM mode operations.

In the example of FIG. 5, the switch control circuitry 504 is configured to: receive a clock signal (Clk_sw) at the first terminal 506; receive Valley_comp at the second terminal 508; receive PFM_pulse_comp at the third terminal 510; receive Peak_comp at the fourth terminal 512; receive PFM_mode at the fifth terminal 514; control a state of PWM_CS at the sixth terminal 516 responsive to Clk_sw, Valley_comp, PFM_pulse_comp, Peak_comp, and PFM_mode; and control a state of HIZ_CS at the seventh terminal 518 responsive to Clk_sw, Valley_comp, PFM_pulse_comp, Peak_comp, and PFM_mode.

In some examples, during PWM mode operations, the switch control circuitry 504 is configured to maintain HIZ_CS in a second state (e.g., a de-asserted or logical low state). With HIZ_CS in the second state, PWM_CS controls the state of HS_CS and LS_CS during the PWM mode to support HS intervals and LS intervals. During the PWM mode, the switch control circuitry 504 may assert PWM_CS responsive to Valley_comp being asserted (indicating the current of the inductor 136 has reached a valley threshold) and may de-asserted PWM_CS responsive to Clk_sw or responsive to Peak_comp being asserted (indicating the current of the inductor 136 has reached a peak threshold).

In some examples, the switch control circuitry 504 is configured to perform PWM mode operations during the transition interval. As another option, the switch control circuitry 504 may adjust some control options. For example, during the transition interval, the switch control circuitry 504 may use the peak comparator to trigger a low-side interval and may adjust the hysteresis current of I_ref_peak based on the PWM ripple.

During PFM mode operations, the switch control circuitry 504 is configured to assert HIZ_CS as needed to provide a pause between HS intervals and LS intervals. Also, during the PFM mode, the switch control circuitry 504 is configured to de-assert PWM_CS responsive to Peak_comp being asserted to initiate a LS interval; and assert HIZ_CS responsive to Valley_comp being asserted, indicating zero current detection.

Figure 6:
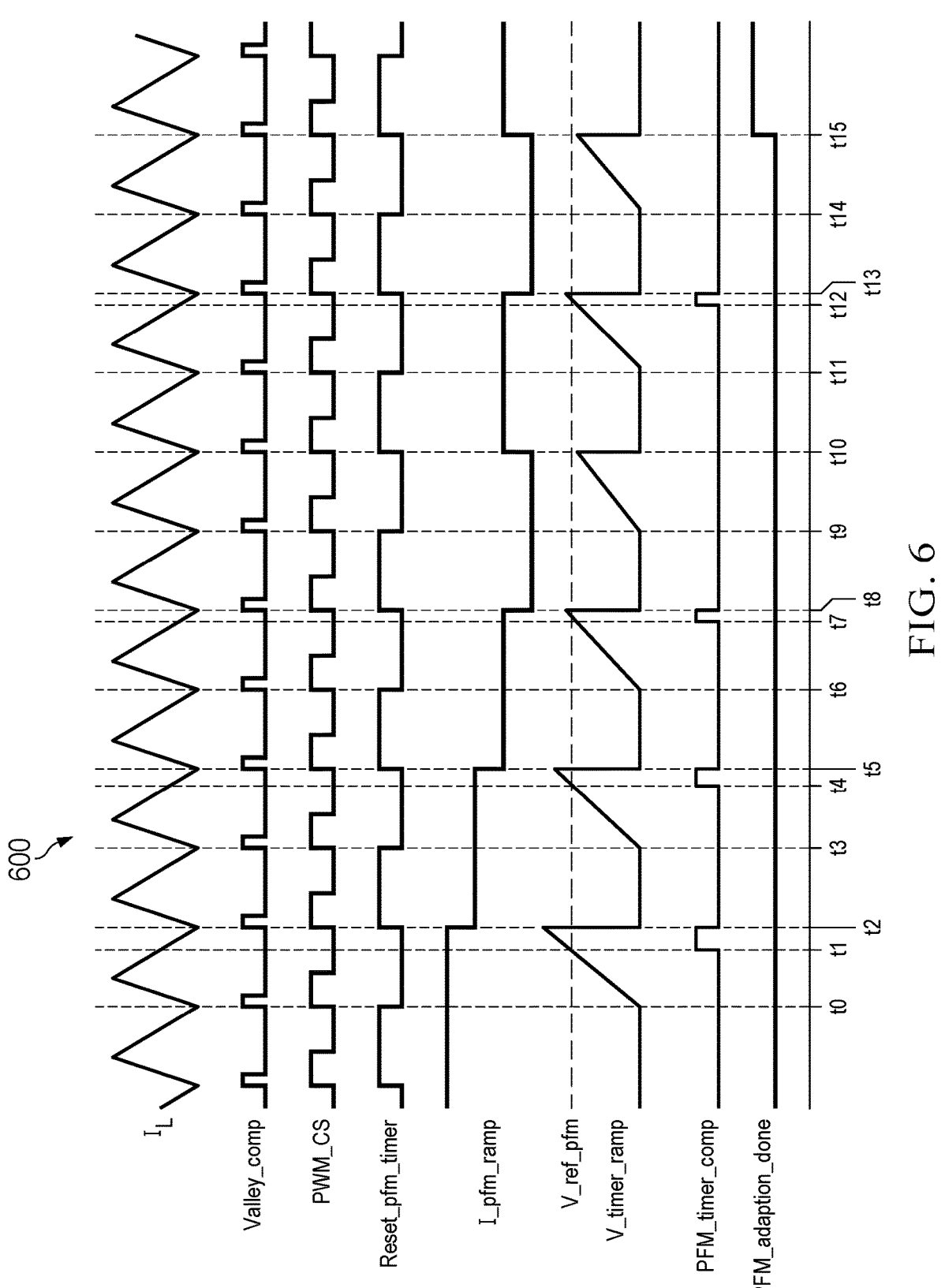
FIG. 6 is a timing diagram showing example waveforms and thresholds during transition from a pulse-width modulation (PWM) mode to a pulse-frequency modulation (PFM) mode.

FIG. 6 is a timing diagram 600 showing example inductor current, thresholds, and control signals during transition from a PWM mode to a PFM mode. For the timing diagram 600, light load detection may be assumed to have already occurred. The waveforms represented in the timing diagram 600 include inductor current (I_L), Valley_comp, PWM_CS, Reset_pfm_timer, I_pfm_ramp, V_timer_ramp, PFM_timer_comp, and PFM_adaptation_done. The timing diagram 600 also includes V_ref_pfm.

In the timing diagram 600, IL ramps up and down and triggers Valley_comp whenever IL reaches a valley threshold (e.g., zero current). Each positive slope ramp of IL corresponds to a HS interval, in which the HS switch 120 is on and the LS switch 128 is off. Each negative slope ramp of IL corresponds to an LS interval, in which the HS switch 120 is off and the LS switch 128 is on. As shown, Reset_pfm_timer has a period that is twice the period of PWM_CS. At time t0, I_pfm_ramp has an initial value and Reset_pfm_timer is de-asserted, which results in V_timer_ramp beginning to rise starting at time t0. In some examples, the initial value for I_pfm_ramp may be based on a middle code (e.g., 6'b100000), which is the reset value of related digital flipflops. At time t1, V_timer_ramp crosses V_ref_pfm, resulting in assertion of PFM_timer_comp. Because PFM_timer_comp is asserted before the next rising edge of PWM_CS, offset current adaption is performed to increase the PFM_timer_comp period. At time t2, Reset_pfm_timer is asserted, which resets (e.g., grounds) V_timer_ramp. Also, I_pfm_ramp is reduced at time t2 (e.g., by increasing the offset current based on Sel_pfm_timer).

At time t3, I_pfm_ramp has a reduced value relative to time t0 and Reset_pfm_timer is de-asserted, which results in V_timer_ramp beginning to rise starting at time t3. In some examples, the step size for I_pfm_ramp depends on the DAC size and the maximum available current that the first current source 412 is able to provide in the PFM mode. In some examples, the maximum available current from the first current source 412 may be equal to gm_pfm*V_valley_zero. The maximum offset current (e.g., when a maximum DAC code is used) is selected to be smaller than the maximum available current from the first current source 412. Without limitation, an example maximum available current from the first current source 412 may be 1 uA, a maximum offset current may be 945 nA, and a step size for I_pfm_ramp may be 15 nA. In different examples, the step size may be adjusted to set accuracy or adaptation speed of PFM timer adaptation. In some examples, the step size of the least significant bit (LSB) of the DAC 402 may be used to select the step size for I_pfm_ramp.

At time t4, V_timer_ramp crosses V_ref_pfm, resulting in assertion of PFM_timer_comp. Because PFM_timer_comp is asserted before the next rising edge of PWM_CS, offset current adaption will continue to increase the PFM_timer_comp period. At time t5, Reset_pfm_timer is asserted, which resets (e.g., grounds) V_timer_ramp. Also, I_pfm_ramp is reduced at time t5 (e.g., by increasing the offset current based on Sel_pfm_timer).

At time t6, I_pfm_ramp has a reduced value relative to time t3 and Reset_pfm_timer is de-asserted, which results in V_timer_ramp beginning to rise starting at time t6. At time t7, V_timer_ramp crosses V_ref_pfm, resulting in assertion of PFM_timer_comp. Because PFM_timer_comp is asserted before the next rising edge of PWM_CS, offset current adaption will continue to increase the PFM_timer_comp period. At time t8, Reset_pfm_timer is asserted, which resets (e.g., grounds) V_timer_ramp. Also, I_pfm_ramp is reduced at time t8 (e.g., by increasing the offset current based on Sel_pfm_timer).

At time t9, I_pfm_ramp has a reduced value relative to time t6 and Reset_pfm_timer is de-asserted, which results in V_timer_ramp beginning to rise starting at time t9. At time t10, the next rising edge of PWM_CS is asserted before V_timer_ramp crosses V_ref_pfm (PFM_timer_comp is thus not asserted). Because the next rising edge of PWM_CS occurs before V_timer_ramp crosses V_ref_pfm, offset current adaption will continue by decreasing the PFM_timer_comp period. At time t10, Reset_pfm_timer is asserted, which resets (e.g., grounds) V_timer_ramp. Also, I_pfm_ramp is increased at time t10 (e.g., by decreasing the offset current based on Sel_pfm_timer).

At time t11, I_pfm_ramp has an increased value relative to time t9 and Reset_pfm_timer is de-asserted, which results in V_timer_ramp beginning to rise starting at time t11. At time t12, V_timer_ramp crosses V_ref_pfm, resulting in assertion of PFM_timer_comp. Because PFM_timer_comp is asserted before the next rising edge of PWM_CS, offset current adaption will increase the PFM_timer_comp period. At time t13, Reset_pfm_timer is asserted, which resets (e.g., grounds) V_timer_ramp. Also, I_pfm_ramp is reduced at time t13 (e.g., by increasing the offset current based on Sel_pfm_timer).

At time t14, I_pfm_ramp has a reduced value relative to time t11 and Reset_pfm_timer is de-asserted, which results in V_timer_ramp beginning to rise starting at time t14. At time t15, the next rising edge of PWM_CS is asserted before V_timer_ramp crosses V_ref_pfm (PFM_timer_comp is thus not asserted). Because the next rising edge of PWM_CS occurs before V_timer_ramp crosses V_ref_pfm again, offset current adaption is complete. In other words, iterative toggling of I_pfm_ramp value between two values indicates that the PFM timer interval is sufficiently aligned with PWM_CS. Accordingly, PFM_adaptation_done is asserted at time t15. After time t15, the PFM mode begins with the PFM timer interval aligned with PWM_CS.

Figure 7:
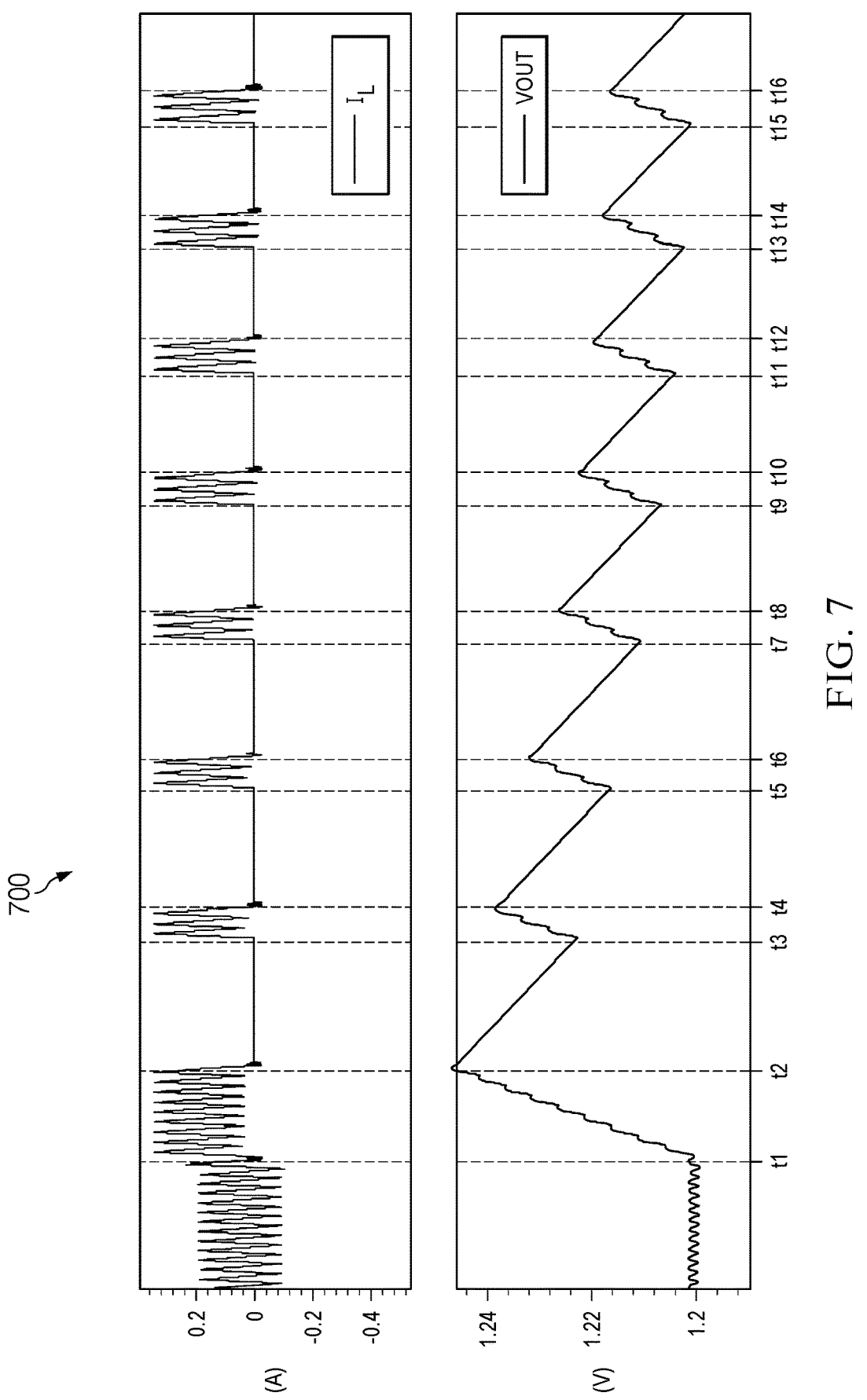
FIG. 7 is a diagram showing example waveforms and thresholds for a switching converter controller without an adaptive PFM timer.

FIG. 7 is a diagram 700 showing example inductor current and output voltage resulting from a switching converter controller without an adaptive PFM timer. In the diagram 700, a PFM mode starts at time t1. Before time t1, IL ramps up and down based on PWM mode operations. At time t1, IL ramps up and down based on PFM mode operations, resulting in a higher average output current and an increase in VOUT. At time t2, VOUT reaches a maximum of about 1.25 V. At time t2, switching is paused until time t3, which causes VOUT to fall. At time t3, IL ramps up and down based on PFM mode operations causing VOUT to rise from time t3 to time t4. At time t4, switching is paused until time t5, wherein causes VOUT to fall. At time t5, IL ramps up and down based on PFM mode operations causing VOUT to rise from time t5 to time t6. At time t6, switching is paused until time t7, wherein causes VOUT to fall. At time t7, IL ramps up and down based on PFM mode operations causing VOUT to rise from time t7 to time t8. At time t8, switching is paused until time t9, wherein causes VOUT to fall. At time t9, IL ramps up and down based on PFM mode operations causing VOUT to rise from time t9 to time t10. At time t10, switching is paused until time t11, wherein causes VOUT to fall. At time t11, IL ramps up and down based on PFM mode operations causing VOUT to rise from time t11 to time t12. At time t12, switching is paused until time t13, wherein causes VOUT to fall. At time t13, IL ramps up and down based on PFM mode operations causing VOUT to rise from time t13 to time t14. At time t14, switching is paused until time t15. At time t15, IL ramps up and down based on PFM mode operations causing VOUT to rise from time t15 to time t16. At time t14, switching is paused. In the example of FIG. 7, VOUT ripple without an adaptive PFM timer has a maximum VOUT ripple of approximately 0.05 V or 50 mV (based on 1.25 V-1.2 V) at time t2, which is significant and may be unacceptable for some power management scenarios.

Figure 8:
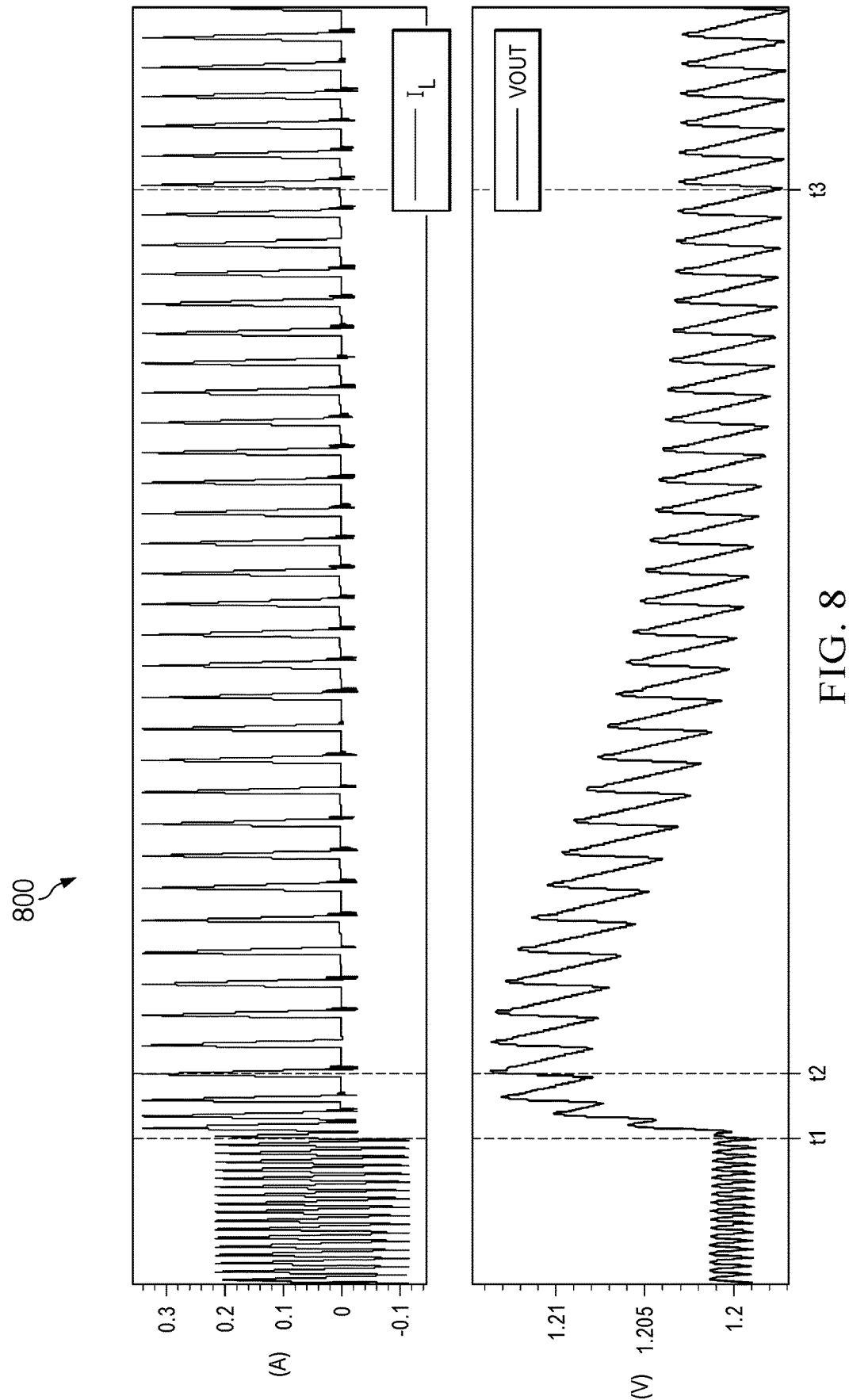
FIG. 8 is a diagram showing example waveforms and thresholds for a switching converter controller with an adaptive PFM timer.

FIG. 8 is a diagram 800 showing example inductor current and output voltage resulting from a switching converter controller with an adaptive PFM timer (e.g., the adaptive PFM timer circuit 164 in FIG. 1, or the adaptive PFM timer circuit 164A in FIG. 4). In the diagram 800, a PFM mode starts at time t1. Before time t1, IL ramps up and down based on PWM mode operations. At time t1, IL ramps up and down based on PFM mode operations, resulting in a higher average output current and an increase in VOUT. At time t2, VOUT reaches a maximum of about 1.214 V. Between time t2 to time t3, IL ramps up and down with pause intervals based on PFM mode operations causing VOUT to settle over time to around 1.2 V. In the example of FIG. 8, VOUT ripple with an adaptive PFM timer has a maximum VOUT ripple of approximately 0.014 V or 14 mV at time t2, which is 3× improvement relative to the VOUT ripple in FIG. 7.

FIG. 9 is a flowchart showing an example switching converter controller method 900. As shown, the switching converter controller method 900 includes identifying a PFM mode trigger at block 902. In some examples, the PFM mode trigger is a light load condition or low-power mode control signal. At block 904, adaptation control signals (e.g., Sel_pfm_timer<5:0>, Reset_pfm_timer, V_valley_zero) are provided to a PFM timer circuit (e.g., the adaptive PFM timer circuit 164 in FIG. 1, or the adaptive PFM timer circuit 164A in FIG. 4) responsive to the PFM mode trigger. At block 906, adaptation results of the PFM timer circuit (e.g., the timing of PFM_timer_comp relative to PWM_CS) are monitored responsive to the adaptation control signals. At block 908, a PFM mode signal (e.g., PFM_adaptation_done or resulting signals) is asserted to initiate a PFM mode responsive to the adaptation results indicating PFM timing is ready (e.g., PFM_time_comp is aligned with a target PFM timing such as the PWM switching period). In some examples, PFM timing is ready when PFM_time_comp is aligned with the rising edge of PWM_CS.

Figure 10:
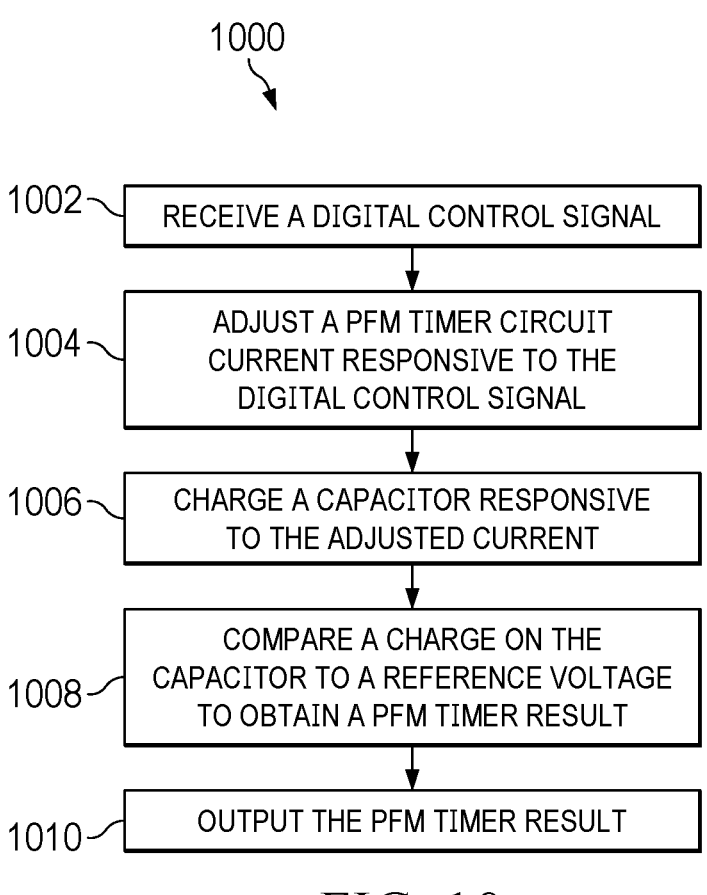
FIG. 10 is a flowchart showing an example PFM timer circuit method.

FIG. 10 is a flowchart showing an example PFM timer circuit method 1000. The PFM timer circuit method 1000 may be performed, for example, by the adaptive PFM timer circuit 164 in FIG. 1, or the adaptive PFM timer circuit 164A in FIG. 4. As shown, the PFM timer circuit method 1000 includes receiving a digital control signal (e.g., Sel_pfm_timer<5:0>) at block 1002. At block 1004, a PFM timer circuit current (I_pfm_ramp in FIG. 4) is adjusted responsive to the digital control signal. At block 1006, a capacitor (e.g., the capacitor C_pfm in FIG. 4) is charged responsive to the adjusted current. At block 1008, a charge on the capacitor is compared to a reference voltage (e.g., V_ref_pfm in FIG. 4) to obtain a PFM timer result (e.g., PFM_timer_comp in FIG. 4). At block 1010, the PFM timer results is output (e.g., to mode control logic as described herein). During a transition interval the PFM timer circuit method 1000 may be repeated until the PFM timer result is aligned with a PWM control signal (e.g., PWM_CS) or a best PFM timer result alignment is determined. In some examples, the PFM timer circuit method 1000 may also include: selecting a reference voltage (e.g., V_valley_zero herein) that is equal to the zero valley current in the PWM mode; and setting the PFM timer circuit current based on the reference voltage. In such examples, adaptive PFM timer control is based on a target reference voltage as well as offset current control based on the digital control signal.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component and/or a conductor.

A circuit or device described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field-effect transistor ("FET") such as an NFET or a PFET, a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control terminal and its first and second terminals. In the context of a FET, the control terminal is the gate, and the first and second terminals are the drain and source. In the context of a BJT, the control terminal is the base, and the first and second terminals are the collector and emitter.

References herein to a FET being "ON" means that the conduction channel of the FET is present and drain current may flow through the FET. References herein to a FET being "OFF" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

What is claimed is:

1. A switching converter controller comprising:
mode control logic; and
a pulse-frequency modulation (PFM) timer circuit coupled to the mode control logic, the PFM timer circuit including:
a first terminal;
a second terminal;
a current source having a first terminal, a second terminal, and a third terminal, the current source configurable to receive a first signal at the second terminal in a first mode and receive a second signal at the second terminal in a second mode, the first signal indicative of a zero valley current, and the second signal indicative of a difference between a feedback voltage and a reference voltage;
a capacitor having a first terminal and a second terminal, the first terminal of the capacitor coupled to the first terminal of the current source;
a comparator having a first terminal, a second terminal, and a third terminal, the first terminal of the comparator coupled to the first terminal of the capacitor, and the third terminal of the comparator coupled to the second terminal of the PFM timer circuit.

2. The switching converter controller of claim 1, wherein the current source is a first current source, the PFM timer circuit includes:

a second current source having a first terminal, a second terminal, and a third terminal, the third terminal of the second current source coupled to the first terminal of the capacitor; and
a digital-to-analog converter (DAC) having a first terminal and a second terminal, the first terminal of the DAC coupled to the first terminal of the PFM timer circuit, and a second terminal of the DAC coupled to the second terminal of the second current source.

3. A switching converter controller comprising:
mode control logic; and
a pulse-frequency modulation (PFM) timer circuit coupled to the mode control logic and configured to:
receive a mode control signal;
responsive to the mode control signal, set a current of the PFM timer circuit responsive to one of a first reference voltage or a feedback error voltage;
charge a capacitor responsive to the current;
compare a charge on the capacitor to a second reference voltage to obtain a PFM timer result; and
output the PFM timer result.

4. The switching converter controller of claim 3, wherein the PFM timer circuit is configurable to set the current of the PFM timer circuit responsive to the mode control signal, signals representing a set of digital values, and the first reference voltage indicative of a zero valley current.

5. The switching converter controller of claim 4, wherein the PFM timer circuit is configured to discharge the capacitor responsive to a second switch control signal.

6. The switching converter controller of claim 5, wherein the PFM timer circuit has a third terminal and a fourth terminal, the PFM timer circuit includes a switch having a first terminal, a second terminal, a third terminal, and a fourth terminal, the first terminal of the switch to receive the first signal, the second terminal of the switch is coupled to the third terminal of the PFM timer circuit, the third terminal of the switch coupled to the fourth terminal of the PFM timer circuit, and the fourth terminal of the switch coupled to the second terminal of the second current source.

7. The switching converter controller of claim 6, wherein the switch is a first switch, the PFM timer circuit has a fifth terminal and includes a second switch having a first terminal, a second terminal, and a third terminal, the first terminal of the second switch coupled to the first terminal of the capacitor, and the second terminal of the second switch coupled to the fifth terminal of the PFM timer circuit.

8. The switching converter controller of claim 7, wherein the mode control logic has a first terminal, a second terminal, a third terminal, and a fourth terminal, the first terminal of the mode control logic coupled to the second terminal of the PFM timer circuit, the second terminal of the mode control logic coupled to the first terminal of the PFM timer circuit, the third terminal of the mode control logic is coupled to the fourth terminal of the PFM timer circuit, and the fourth terminal of the mode control logic is coupled to the fifth terminal of the PFM timer circuit.

9. The switching converter controller of claim 8, further comprising an error amplifier having a first terminal, a second terminal, and a third terminal, the third terminal of the error amplifier coupled to the fourth terminal of the PFM timer circuit.

10. The switching converter controller of claim 9, further comprising a voltage-to-current converter, a peak comparator, and a valley comparator, the voltage-to-current converter having a first terminal, a second terminal, and a third terminal, the peak comparator having a first terminal, a second terminal, and a third terminal, the valley comparator having a first terminal, a second terminal, and a third terminal, the first terminal of the voltage-to-current converter coupled to the third terminal of the error amplifier, the second terminal of the voltage-to-current converter coupled to the second terminal of the peak comparator, and the third terminal of the voltage-to-current converter coupled to the first terminal of the valley comparator.

11. The switching converter controller of claim 10, further comprising driver circuitry having a first terminal, a second terminal, a third terminal, and a fourth terminal, wherein the mode control logic has a fifth terminal, a sixth terminal, a seventh terminal, and an eighth terminal, the fifth terminal of the mode control logic coupled to the third terminal of the peak comparator, the third terminal of the valley comparator coupled to the sixth terminal of the mode control logic, the seventh terminal of the mode control logic coupled to the first terminal of the driver circuitry, and the eighth terminal of the mode control logic coupled to the second terminal of the driver circuitry.

12. The switching converter controller of claim 11, wherein the mode control logic is configured to:
    receive a clock signal, a PFM timer result, a peak compare result, and a valley compare result;
    adjust a pulse-width modulation (PWM) control signal state and high-impedance control signal state responsive to the clock signal, the PFM timer result, the peak compare result, and the valley compare result;
    identify a light load trigger; and
    provide adaptation control signals to the PFM timer circuit responsive to the light load trigger.

13. The switching converter controller of claim 3, further comprising mode control logic configured to:
    receive a light load signal;
    provide adaptation control signals to the PFM timer circuit responsive to the light load signal;
    monitor adaptation results of the PFM timer circuit responsive to the adaptation control signals; and
    transition to a PFM mode responsive to the adaptation results indicating PFM timing is aligned with a target PFM timing.

14. The switching converter controller of claim 4, further comprising an error amplifier configured to provide the feedback error voltage responsive to an output voltage and a reference voltage.

15. The switching converter controller of claim 5, further comprising mode control logic configured to provide the mode control signal, the signals, and a switch control signal.

16. A system comprising:
a power stage; and
a switching converter controller coupled to the power stage, the switching converter controller configurable to:
    operate the power stage in a first mode, in which a period of a switching cycle is set by a clock signal in the first mode;
    receive a trigger signal;
    responsive to receiving the trigger signal, transition the power stage to a second mode, in which a period of a switching cycle in the second mode is equal to the period of the switching cycle in the first mode; and
    after the transition, vary the period of the switching cycle the second mode to set an output current of the power stage.

17. The system of claim 16, wherein the second mode is a pulse frequency modulation (PFM) mode, and the switching converter controller includes a PFM timer circuit configurable to:
    receive a mode control signal;
    adjust a current of the PFM timer circuit responsive to the mode control signal;
    charge a capacitor responsive to the adjust current;
    compare a charge on the capacitor to a reference voltage to obtain a PFM timer result; and
    responsive to the PFM timer result, transition to the PFM.

18. The system of claim 17, wherein the PFM timer circuit is configurable to adjust the current of the PFM timer circuit responsive to the mode control signal.

19. The system of claim 18, wherein the PFM timer circuit includes a digital-to-analog converter (DAC), a first current source, and a second current source, the first current source is configured to provide a first current responsive to the switch control signal, the DAC is configurable to provide an analog signal responsive to a digital control signal, and the second current source is configurable to adjust the first current responsive to the analog signal.

20. The system of claim 19, wherein the first mode is a pulse width modulation (PWM) mode having a zero valley current, and the first current source is configured to provide a current, to the PFM timer circuit responsive to a zero valley reference voltage representing the zero valley current.

\* \* \* \* \*